United States Patent
Chainer et al.

(10) Patent No.: US 9,883,616 B2
(45) Date of Patent: Jan. 30, 2018

(54) MANIFOLD HEAT EXCHANGER

(71) Applicant: International Business Machines Corporation, Armonk, NY (US)

(72) Inventors: Timothy J. Chainer, Putnam Valley, NY (US); Pritish R. Parida, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 511 days.

(21) Appl. No.: 14/500,970

(22) Filed: Sep. 29, 2014

(65) Prior Publication Data

US 2016/0091262 A1   Mar. 31, 2016

(51) Int. Cl.
- *F28F 9/02* (2006.01)
- *H05K 7/20* (2006.01)
- *F28F 9/26* (2006.01)
- *F28D 9/00* (2006.01)

(52) U.S. Cl.
CPC .......... *H05K 7/20781* (2013.01); *F28F 9/02* (2013.01); *H05K 7/20272* (2013.01); *H05K 7/20772* (2013.01); *F28D 9/0031* (2013.01); *F28F 9/26* (2013.01)

(58) Field of Classification Search
CPC .......... H05K 7/20218; H05K 7/20272; H05K 7/20627–7/20645; H05K 7/20763–7/20781; G06F 1/20; G06F 1/203; G01M 3/26
USPC .................................................. 361/699, 702
See application file for complete search history.

(56) References Cited

U.S. PATENT DOCUMENTS

| | | | |
|---|---|---|---|
| 7,002,799 B2 | 2/2006 | Malone et al. | 361/699 |
| 7,349,213 B2* | 3/2008 | Campbell | H05K 7/2079 165/104.33 |
| 7,551,440 B2 | 6/2009 | Belady et al. | 361/699 |
| 7,907,406 B1 | 3/2011 | Campbell et al. | 361/699 |
| 8,208,258 B2 | 6/2012 | Campbell et al. | 361/699 |
| 8,274,790 B2 | 9/2012 | Campbell et al. | 361/696 |
| 8,320,125 B1* | 11/2012 | Hamburgen | H05K 7/2079 165/104.33 |
| 8,493,738 B2 | 7/2013 | Chainer et al. | 361/700 |
| 8,514,575 B2 | 8/2013 | Goth et al. | 361/698 |
| 9,010,141 B2* | 4/2015 | Harrington | F28D 1/0246 165/104.32 |
| 2004/0057211 A1* | 3/2004 | Kondo | G06F 1/20 361/696 |
| 2004/0265662 A1* | 12/2004 | Brignone | H01M 8/04029 429/440 |

(Continued)

FOREIGN PATENT DOCUMENTS

| | | | |
|---|---|---|---|
| JP | 2009529237 | 8/2009 | F25D 17/00 |
| JP | 2010054075 | 3/2010 | F24F 11/02 |

*Primary Examiner* — Zachary M Pape
*Assistant Examiner* — Amir Jalali
(74) *Attorney, Agent, or Firm* — Ido Tuchman; Vazken Alexanian

(57) ABSTRACT

A manifold for cooling electronic equipment, the manifold including a facility side coolant supply line, a facility side coolant return line, liquid-to-liquid heat exchangers, and pumps. The liquid-to-liquid heat exchangers are connected in parallel to the facility side coolant supply line. Each of the pumps is coupled to a liquid-to-liquid heat exchanger and regulates coolant flow through the coupled liquid-to-liquid heat exchangers.

13 Claims, 8 Drawing Sheets

(56) References Cited

U.S. PATENT DOCUMENTS

| | | | | |
|---|---|---|---|---|
| 2005/0045309 A1* | 3/2005 | Kondo | H01L 23/427 | 165/80.3 |
| 2005/0126747 A1* | 6/2005 | Chu | H05K 7/2079 | 165/11.1 |
| 2005/0244280 A1 | 11/2005 | Malone et al. | 417/286 | |
| 2012/0111027 A1* | 5/2012 | Campbell | F25B 21/02 | 62/3.3 |
| 2012/0120603 A1* | 5/2012 | Campbell | H05K 7/20836 | 361/698 |
| 2012/0180979 A1* | 7/2012 | Harrington | F28D 1/0246 | 165/11.1 |
| 2013/0094139 A1* | 4/2013 | Campbell | H05K 7/20772 | 361/679.47 |
| 2013/0205822 A1* | 8/2013 | Heiland | H05K 7/2079 | 62/259.2 |
| 2013/0233008 A1* | 9/2013 | Yamashita | F25B 1/10 | 62/196.1 |
| 2014/0085822 A1* | 3/2014 | Campbell | H05K 7/203 | 361/700 |
| 2014/0090409 A1* | 4/2014 | Yamashita | F25B 9/006 | 62/196.1 |
| 2014/0133099 A1* | 5/2014 | Campbell | H05K 7/20781 | 361/698 |
| 2014/0202678 A1* | 7/2014 | Goth | H05K 7/20772 | 165/287 |
| 2014/0251583 A1* | 9/2014 | Eriksen | G06F 1/206 | 165/104.33 |
| 2015/0048950 A1* | 2/2015 | Zeighami | H05K 7/20781 | 340/605 |
| 2015/0128628 A1* | 5/2015 | Kawagoe | F25B 13/00 | 62/160 |
| 2015/0189796 A1* | 7/2015 | Shedd | F25B 41/00 | 361/699 |
| 2016/0091262 A1* | 3/2016 | Chainer | H05K 7/20272 | 165/104.31 |

* cited by examiner

MANIFOLD HEAT EXCHANGER

BACKGROUND

This invention relates to the cooling of electronic equipment, and more particularly to cooling of rack-mounted electronic equipment.

Data centers are facilities that house numerous computer systems arranged in the form of electronics racks. Typically, a data center houses on the order of a few thousands of electronic racks. Each computer system in a rack may include one or more processors, memory devices, controllers, power converters and manipulators and other such electronic components which perform different operations and dissipate varying amounts of heat. Moreover, depending upon the state of operation, a computer system may dissipate on the order of few hundreds of Watts to few thousands of Watts. Therefore, significant amount of cooling is required to keep the electronic components within an optimum operating temperature range (typically, 75° C. to 85° C.).

According to the 2007 Report to Congress on Server and Data Center Energy Efficiency, in 2005, server driven power usage amounted to 1.2% of total US energy consumption. Over the past six years, energy use by these centers and their supporting infrastructure is estimated to have increased by nearly 100 percent (United States Department of Energy Information and Communications Technology Roadmap). In the face of growing global energy demand, uncertain energy supplies, and volatile energy prices, innovative solutions are needed to radically advance the energy efficiency of these data center systems.

Recent studies have shown that cooling energy to comprise 25% to 40% of the total data center energy consumption. Liquid cooling of computer systems is one method of increasing the cooling energy efficiency. However, concerns such as liquid leaks limit the market penetration and implementation of liquid cooling solutions for data center cooling. In conventional liquid-cooled systems, the liquid coolant is provided by a liquid distribution unit using a liquid loop. In the event of a leak, all the liquid contained in the liquid loop may be lost, forcing the shutdown of all connected computer systems, regardless of their proximity to the leak.

BRIEF SUMMARY

Accordingly, one example aspect of the present invention is a manifold for cooling electronic equipment. The manifold includes a facility side coolant supply line, a facility side coolant return line, liquid-to-liquid heat exchangers, couplings to facilitate server side fluidic connections and pumps. The liquid-to-liquid heat exchangers of the manifold are connected in parallel to the facility side coolant supply line. Each of the pumps is coupled to a liquid-to-liquid heat exchanger and regulates coolant flow through the coupled liquid-to-liquid heat exchangers.

Another aspect of the present invention is an apparatus for cooling electronic equipment. The apparatus includes a server rack and a manifold mounted on the server rack. The server rack houses a plurality of servers. The manifold includes a facility side coolant supply line, a facility side coolant return line, liquid-to-liquid heat exchangers, and pumps. The liquid-to-liquid heat exchangers of the manifold are connected in parallel to the facility side coolant supply line. Each of the pumps is coupled to a liquid-to-liquid heat exchanger and a server, and the pumps regulate coolant flow through the coupled liquid-to-liquid heat exchangers and the coupled servers.

Another aspect of the present invention is a method of liquid cooling using a manifold. The method includes detecting that a server on a server rack is connected to the manifold, enabling liquid coolant to flow through a liquid-to-liquid heat exchanger connected to the server upon detecting that the server is connected to the manifold, and activating a pump coupled to the liquid-to-liquid heat exchanger upon detecting that the server is connected to the manifold. The liquid-to-liquid heat exchanger connected to the server is one of multiple liquid-to-liquid heat exchangers connected in parallel at the manifold to a facility side coolant supply line. The pump is configured to regulate coolant flow from the liquid-to-liquid heat exchanger to the server.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1A:
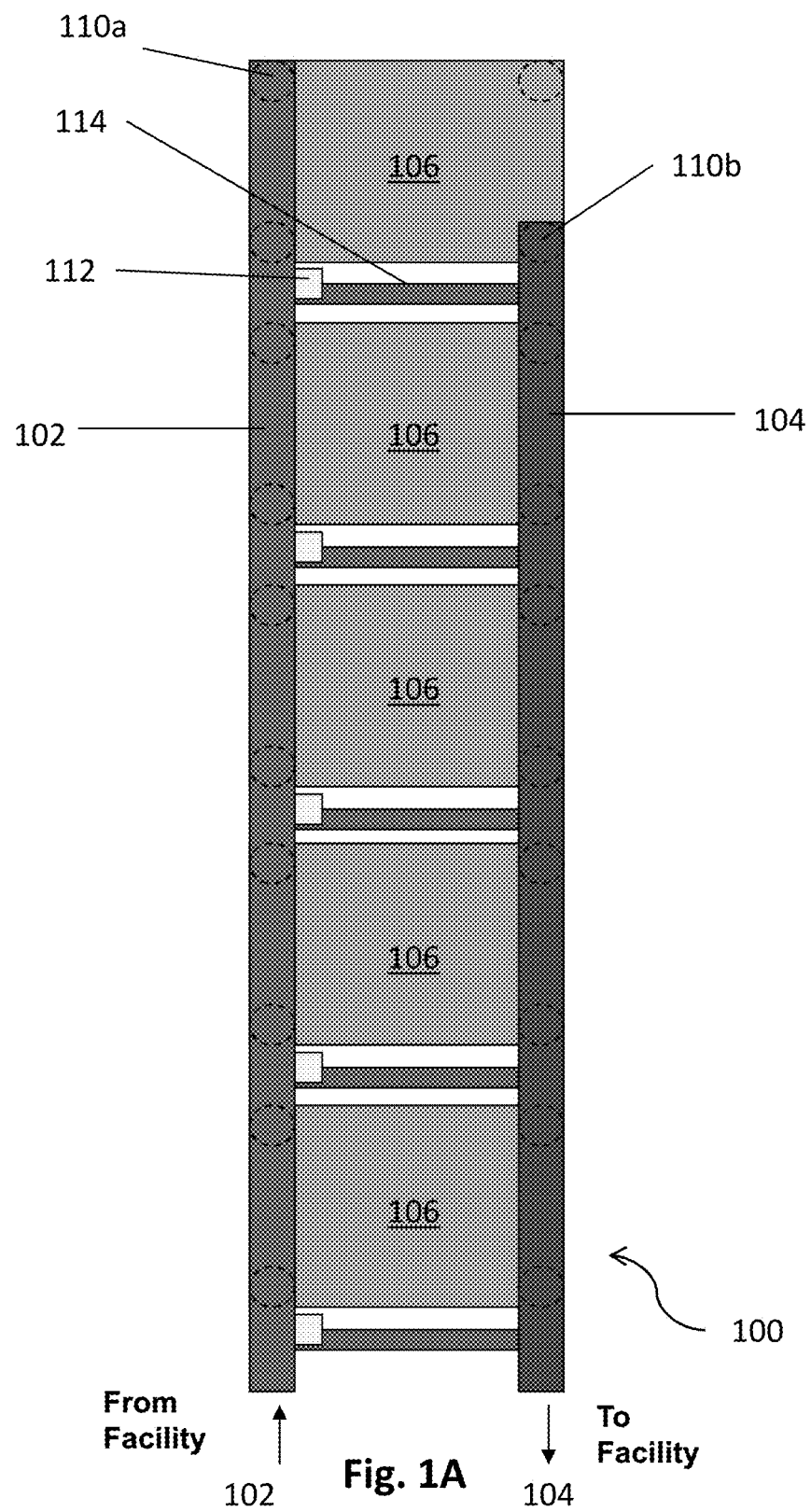
FIGS. 1A and 1B show schematic front and side views, respectively, of a manifold for cooling electronic equipment in accordance with one embodiment of the invention.

The present invention is described with reference to embodiments of the invention. Throughout the description of the invention reference is made to FIGS. 1-5. When referring to the figures, like structures and elements shown throughout are indicated with like reference numerals.

Figure 1B:
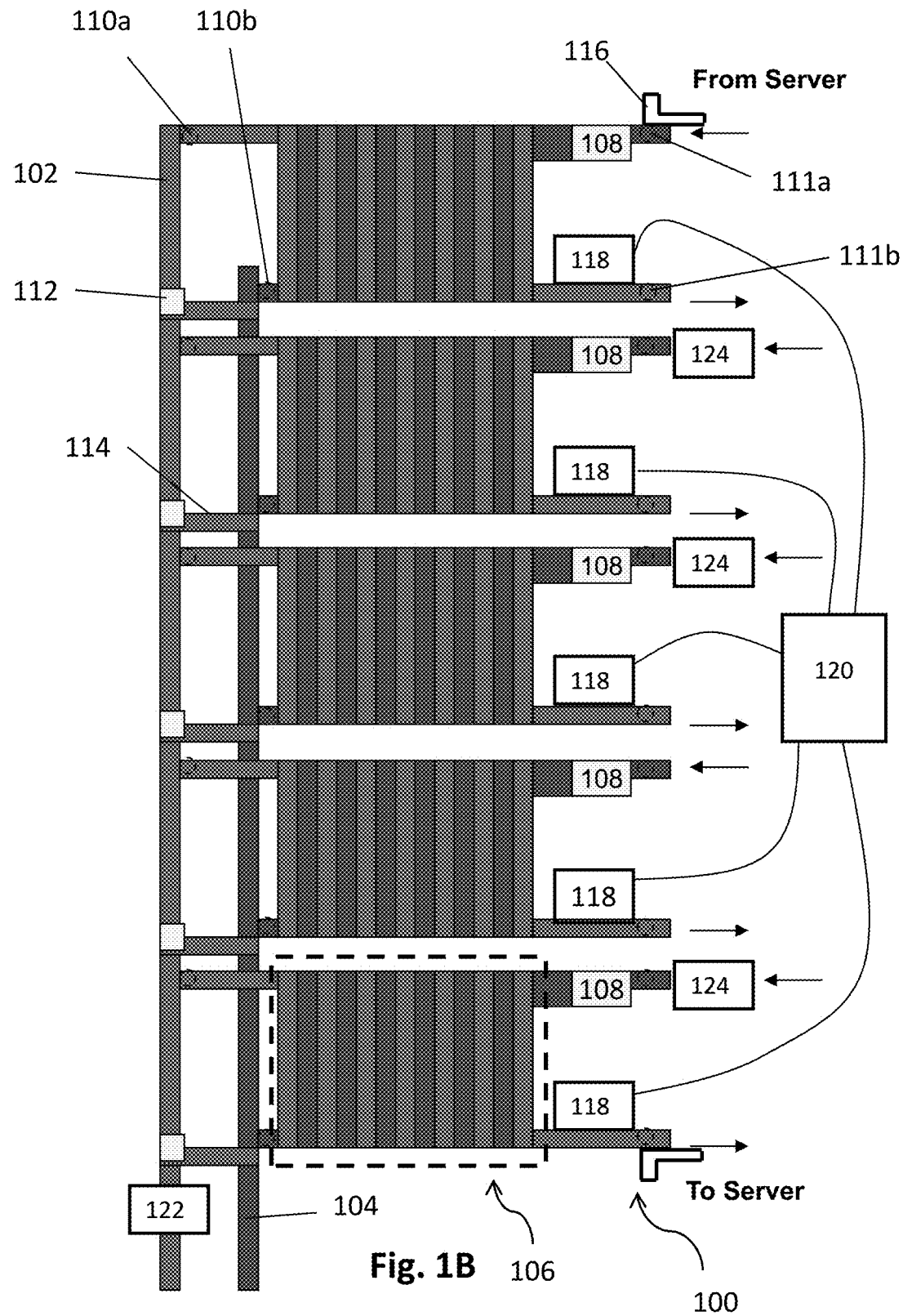

FIGS. 1A and 1B show a manifold 100 for cooling electronic equipment in accordance with one embodiment of the invention. The manifold 100 includes a facility side coolant supply line 102, a facility side coolant return line 104, liquid-to-liquid heat exchangers 106, and pumps 108. The manifold 100 may also include mounting hardware 116 for attaching the manifold to a server rack. The facility side coolant supply line 102 supplies coolant from the data center room to the manifold 100. The facility side coolant return line 102 returns coolant from manifold to the data center room. It is contemplated that the manifold may include connection ports to facilitate coolant connections from the server-side to heat exchangers.

The liquid-to-liquid heat exchangers 106 of the manifold 100 are connected in parallel to the facility side coolant supply line 102. The liquid-to-liquid heat exchangers 106 may also be connected in parallel to the facility side coolant return line 104.

According to one embodiment of the invention, the facility side coolant supply line 102 and the facility side coolant return line 104 of the manifold 100 may be connected from a modular water unit (MWU). According to an embodiment of the invention, the liquid-to-liquid heat exchanger 106 may include a parallel plate heat exchanger. Each of the pumps 108 is coupled to a liquid-to-liquid heat exchanger 106. The pumps 108 regulate coolant flow through their respective liquid-to-liquid heat exchangers 106.

According to an embodiment of the invention, the manifold 100 may also include facility side pressure sensors 110a and 110b and/or server side pressure sensors 111a and 111b. Each set of the pressure sensors is connected to a respective liquid-to-liquid heat exchanger 106. The pressure sensors 111a and 111b may be used to monitor pressure differentials in coolant flow in and out of the server. The pressure sensors 110a and 110b may also be used to monitor pressure differential between coolant flow from the facility side coolant supply line 102 to the liquid-to-liquid heat exchanger 106 and coolant flow from the liquid-to-liquid heat exchanger 106 to the facility side coolant return line 104. For example, the difference between the pressure values obtained from the supply facility side pressure sensors 110a minus the return facility side pressure sensors 110b give delta P which is equal to constant x flow rate for laminar flows. Similar pressure differentials may be measured with server side supply pressure sensors 111a and server side return pressure sensors 111b. Alternately, the manifold 100 can include a facility side flowmeter 122 to measure coolant supply flow. Additionally, server side flowmeters 124 may be used to measure server side coolant flow through the liquid-to to-liquid heat exchanger.

According to another embodiment of the invention, the manifold 100 may also include valves 112. The valves 112 may be coupled to the facility side coolant supply line 102. Furthermore, each of the valves 112 may control coolant flow from the facility side coolant supply line 102 to a respective liquid-to-liquid heat exchanger 106.

According to yet another embodiment of the invention, the manifold 100 may include bypass lines 114. The valves 112 may regulate coolant flow from the facility side coolant supply line 102 to the respective liquid-to-liquid heat exchanger and a respective bypass line of the plurality of bypass lines.

According to an embodiment of the invention, the valves 112 may be manipulated to allow full, partial, or no coolant flow into the liquid-to-liquid heat exchangers 106, the bypass lines 114, and to downstream portions of the facility side coolant supply line 102.

According to another embodiment of the invention, the manifold 100 may also include a leak detector apparatus 120. The leak detector apparatus can include pressure measurements from sensors 111a and 111b and flow-rate measurements to detect leaks.

According to an embodiment of the invention, the components of the manifold 100, including but not limited to its liquid-to-liquid heat exchangers 106, valves 112, pressure sensors 110, and leak detector apparatus 120 may be controlled electronically by one or more controllers. According to an embodiment of the invention, the servers may function as controllers, with each server responsible for controlling its respective liquid-to-liquid heat exchanger, pump, valves, and pressure sensors. According to another embodiment of the invention the manifold 100 may be controlled by a single controller. A controller may be connected to various components of the manifold 100 by communication linkage devices such as USB connections and cellular hookup.

According to an embodiment of the invention, the servers or IT equipment contained in the server rack may include a liquid cooling structure. The liquid cooling structure of each server may plug in to the manifold 100 and may form a closed liquid cooling loop at the individual server level. The server liquid coolant loops inside the individual liquid-to-liquid heat exchangers 106 may also provide fluid isolation such that the volume of liquid in the server is less than the volume contained in the liquid cooling loop. The liquid-to-liquid heat exchangers 106 may also have dedicated pumps 108 at the manifold level to ensure closed liquid cooling loops for individual servers or individual IT equipment.

According another one embodiment of the invention, facility side coolant supply line 102 and the facility side coolant return line 104 may form a facility side coolant loop. The liquid-to-liquid heat exchangers 106 may transfer the heat from the server components to a facility side coolant loop while the pumps 108 provide the coolant flow inside the connected server.

According to an embodiment of the invention, the manifold heat exchanger may also include pressure sensors 110a, 110b, 111a, 111b to monitor the coolant pressure in the server coolant loop as well as in the facility side coolant loop. The manifold 100 may also include leak detectors 118, controllable valves and a controller for regulating the coolant flow on either coolant loops.

Figure 2A:
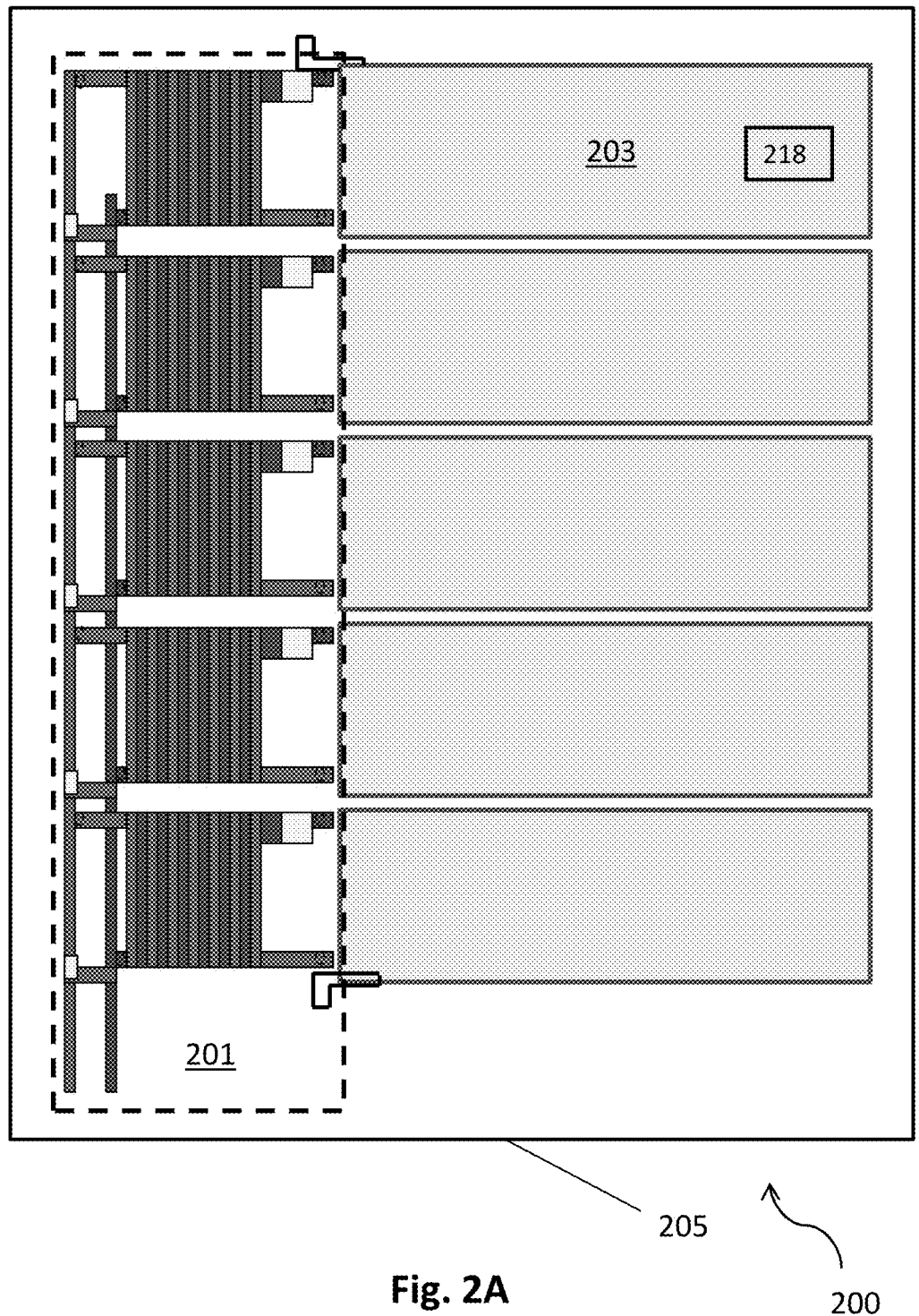
FIG. 2A shows a schematic side view of an apparatus for cooling electronic equipment in accordance with one embodiment of the invention.
Figure 2B:
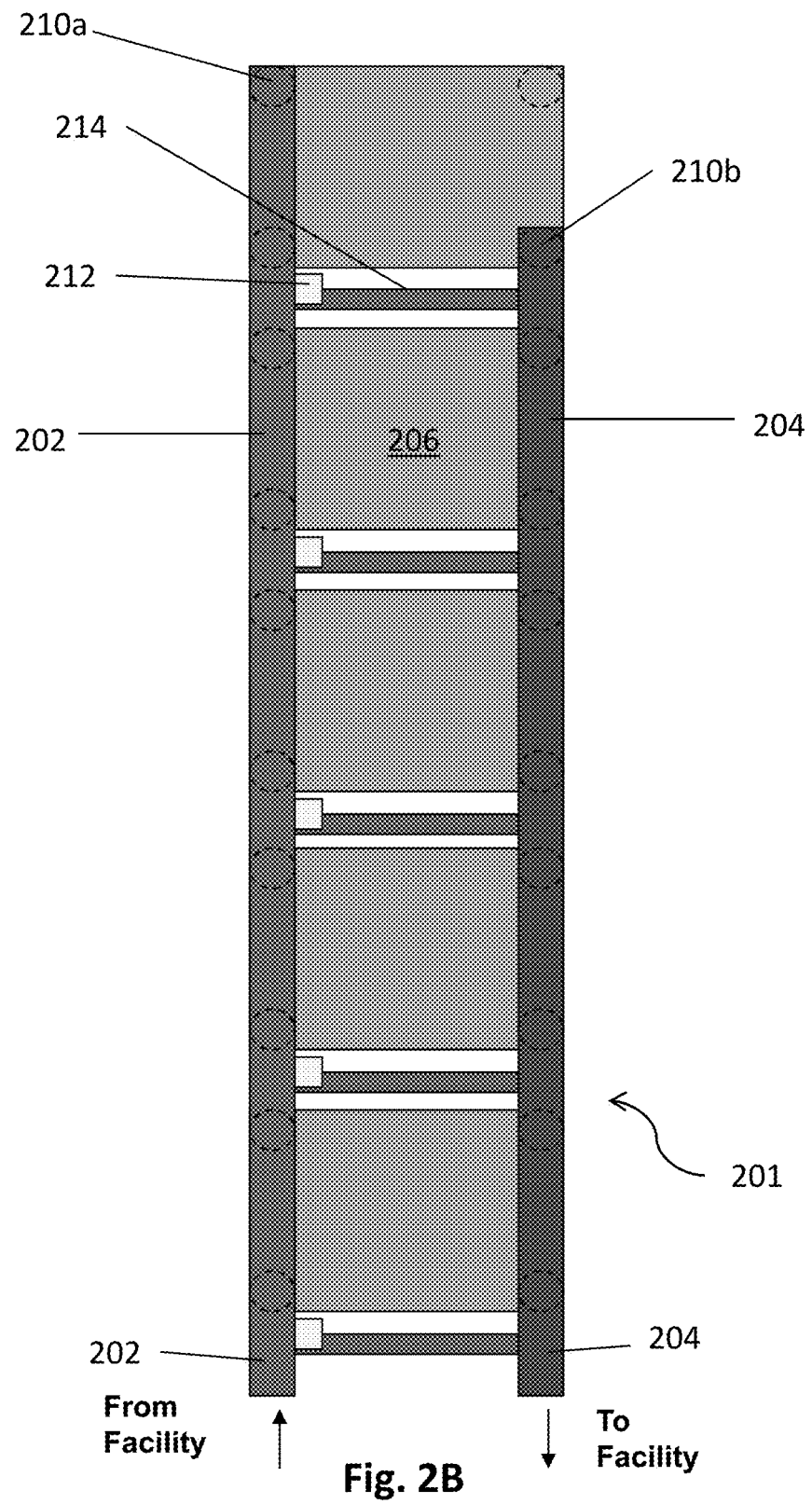
FIGS. 2B and 2C show schematic front and side views, respectively, of the manifold component of the apparatus for cooling electronic equipment shown in FIG. 2A in accordance with one embodiment of the invention.
Figure 2C:
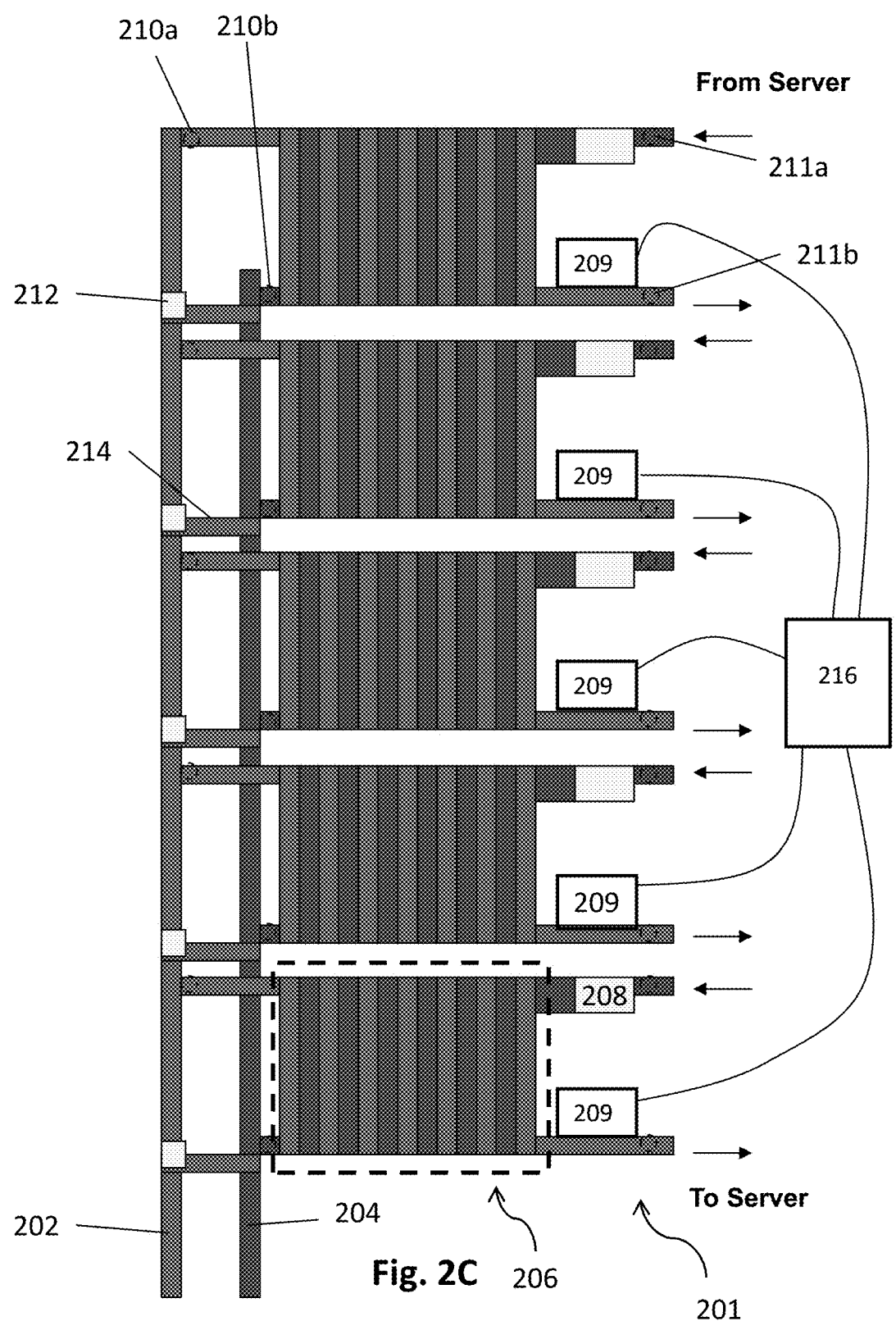

FIGS. 2A-2C show an apparatus 200 for cooling electronic equipment, in accordance with one embodiment of the invention. The apparatus comprises a server rack 205 and a manifold 201 mounted on the server rack 205. The server rack 205 may house a plurality of servers 203. The manifold 201 includes a facility side coolant supply line 202, a facility side coolant return line 204, liquid-to-liquid heat exchangers 206, and pumps 208. The manifold 201 may be a field replaceable unit.

The liquid-to-liquid heat exchangers 206 of the manifold 201 are connected in parallel to the facility side coolant supply line 202. The liquid-to-liquid heat exchangers 206 may also be connected in parallel to the facility side coolant return line 204.

According to one embodiment of the invention, facility side coolant supply line 202 and the facility side coolant return line 204 of the manifold 201 may be connected from a modular water unit (MWU). According to an embodiment of the invention, the liquid-to-liquid heat exchanger 206 may include a parallel plate heat exchanger.

Each of the pumps 208 is coupled to a liquid-to-liquid heat exchanger 206 and a server 203. The pumps 208 may regulate coolant flow through the coupled liquid-to-liquid heat exchangers 206 and the coupled servers 203. Furthermore, each of the pumps 208 may be coupled to a respective liquid-to-liquid heat exchanger 206. The pumps 208 may also regulate coolant flow through their respective liquid-to-liquid heat exchangers 206. The pumps 208, their respective liquid-to-liquid heat exchangers 206, and their respective servers 203 form a plurality of discrete coolant flow loops. This structure isolates the fluid volumes for each individual server which includes the fluid loop in the server and the corresponding liquid to liquid heat exchanger from the fluid volumes in the manifold and the other servers in the rack. In the event of a leak within one server, the amount of fluid which can leak is limited to only the fluid volume for the server and its corresponding liquid to liquid heat exchanger. This is roughly 1-5% of the total volume of the system.

According to another embodiment of the invention, the manifold 201 of the apparatus 200 may also include leak detectors 209. The leak detectors 209 function to detect coolant leakage in the server rack 205.

According to an embodiment of the invention, the manifold 201 may also include pressure sensors 210a and 210b (facility side pressure sensors) and pressure sensors 211a and 211b (server side pressure sensors). Each set of pressure sensors 210a and 210b and/or 211a and 211b may be connected to a respective liquid-to liquid-heat exchanger 206. As mentioned above, pressure sensors 211a and 211b may be used to monitor pressure differentials in coolant flow in and out of the heat exchanger on the server side. Pressure sensors 210a and 210b may be used to monitor pressure differential between coolant flow from the facility side coolant supply line 102 to the liquid-to-liquid heat exchanger 206 and coolant flow from the liquid-to-liquid heat exchanger 206 to the facility side coolant return line 204. As discussed above, the manifold 201 can include facility side flowmeters and/or server side flow meters to measure coolant supply flow.

According to yet another embodiment of the invention, the manifold 201 of the apparatus 200 may also include valves 212. The valves 212 may be coupled to the facility side coolant supply line 202. Furthermore, each of the valves 212 may control coolant flow from the facility side coolant supply line 202 to a respective liquid-to-liquid heat exchanger 206.

According to yet another embodiment of the invention, the manifold 201 of the apparatus 200 may include bypass lines 214. The valves 212 may regulate coolant flow from the facility side coolant supply line 202 between the respective liquid-to-liquid heat exchanger 206 and a respective bypass line 214.

According to an embodiment of the invention, the valves 212 may be manipulated to allow full, partial, or no coolant flow into the liquid-to-liquid heat exchangers 206, the bypass lines 214, and to downstream portions of the facility side coolant supply line 202.

According to another embodiment of the invention, the manifold 100 may also include a leak detector apparatus 216.

According to an embodiment of the invention, the components of the manifold 201, including but not limited to its liquid-to-liquid heat exchangers 206, valves 212, pressure sensors 210 and 210b, and leak detector apparatus may be controlled electronically by one or more controllers. According to an embodiment of the invention, the servers 203 may function as controllers, with each server responsible for controlling its respective liquid-to-liquid heat exchanger, pump, valves, and pressure sensors. According to another embodiment of the invention the manifold 100 may be controlled by a single controller. A controller may be connected to various components of the manifold 100 by communication linkage devices such as USB connections and cellular hookup 218.

According to an embodiment of the invention, the servers 203 or IT equipment contained in the server rack may include a liquid cooling structure. The liquid cooling structure of each server 203 may plug in to the manifold 201 and may form a closed liquid cooling loop at the individual server level. The server liquid coolant loops inside the individual liquid-to-liquid heat exchangers 206 may also provide fluid isolation such that the volume of liquid in the server 203 is less than the volume contained in the liquid cooling loop. The liquid-to-liquid heat exchangers 206 may also have dedicated pumps 208 at the manifold level to ensure closed liquid cooling loops for individual servers or individual IT equipment.

According to another embodiment of the invention, facility side coolant supply line 202 and the facility side coolant return line 204 may form a facility side coolant loop. The liquid-to-liquid heat exchangers 206 may transfer the heat from the server components to a facility side coolant loop while the pumps 208 provide the coolant flow inside the connected server.

According to an embodiment of the invention, the manifold heat exchanger may also include pressure sensors 210a, 210b (facility side pressure sensors) and 211a, 211b (server side pressure sensors) to monitor the coolant pressure in the server coolant loop as well as in the facility side coolant loop. The manifold 201 may also include leak detectors, controllable valves and a controller for regulating the coolant flow on either coolant loops.

Figure 3:
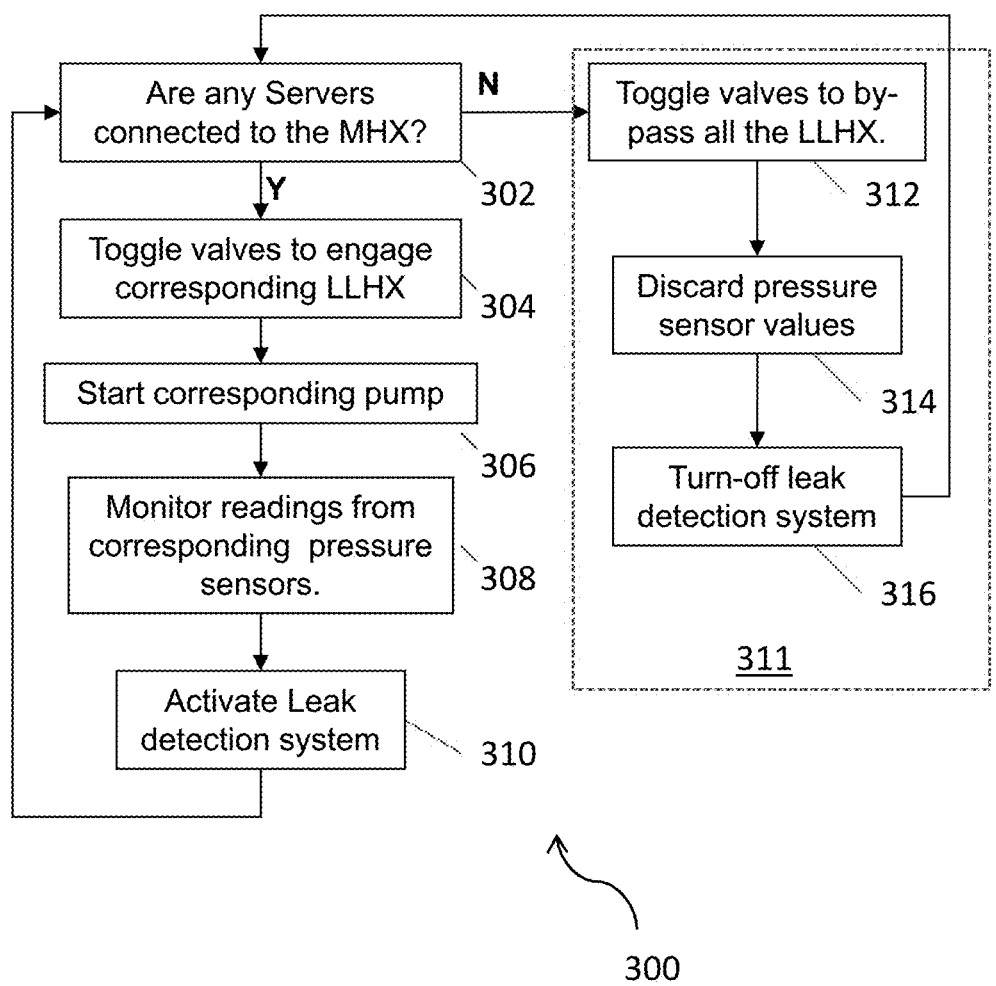
FIG. 3 shows a first method of liquid cooling using a manifold in accordance with an embodiment of the invention.

FIG. 3 shows a first method of liquid cooling 300 using a manifold in accordance with an embodiment of the invention. Accordingly, the manifold may also hereinafter be referred to as the manifold heat exchanger (MHX). According to an embodiment of the invention, the method 300 may be used when a server is connected to the manifold heat exchanger.

The method 300 begins with a server detection step 302. The server detection step 302 involves detecting that a server on a server rack is connected to the manifold. According to an embodiment of the invention, the server detection step 302 includes determining if there are any servers connected to the manifold heat exchanger.

After the server detection step 302, the method 300 proceeds to a heat exchanger activation step 304. The heat exchanger activation step 304 involves allowing liquid coolant to flow through a liquid-to-liquid heat exchanger (LLHX) connected to the server. The liquid-to-liquid heat exchanger may be one of a plurality of liquid-to-liquid heat exchangers connected in parallel at the manifold to a facility side coolant supply line.

At the heat exchanger activation step 304, a valve coupled to the facility side coolant supply line also may be manipulated to allow coolant flow from the facility side coolant supply line to the liquid-to-liquid heat exchanger. The heat exchanger activation step 304 may involve toggling specific valves coupled to the facility side coolant supply line in order to engage their corresponding liquid-to-liquid heat exchanger. According to one embodiment of the invention, the valves may be oriented such that the facility side coolant, the coolant flowing through the facility side coolant supply line and the facility side coolant return line, flows through the corresponding liquid-to-liquid heat exchanger.

After the heat exchanger activation step 304, the method 300 proceeds to a pump activation step 306. At the pump activation step 306, a pump coupled to the liquid-to-liquid heat exchanger is activated or powered on. The pump may be configured to regulate coolant flow from the liquid-to-liquid heat exchanger to the server. The pump may correspond to the previously activated liquid-to-liquid heat exchanger. The pump activation step 306 may create an isolated coolant flow loop that includes the liquid-to-liquid heat exchanger, the pump, and the server.

According to an embodiment of the invention, after the pump activation step 306, the method may proceed to pressure monitoring step 308. The pressure monitoring step 308 may involve monitoring readings or values from pressure sensors corresponding to the previously activated liquid-to-liquid heat exchanger.

After the pressure monitoring step 308, the method may proceed to a leak detection system activation step 310. The leak detection system activation step 310 involves enabling a coolant leak detection system for the server.

According to an embodiment of the invention, if no server is detected at the server detection step 302, the method may proceed to a manifold shutdown sequence 311 comprised of a liquid-to-liquid heat exchanger bypass step 312, followed by a pressure reading discard step 314, and subsequently followed by a leak detection system deactivation step 316.

At the liquid-to-liquid heat exchanger bypass step 312, the liquid coolant bypasses all the liquid-to-liquid heat exchangers in the manifold. The liquid-to-liquid heat exchanger bypass step 312 may involve manipulating or toggling valves coupled to the facility side coolant supply line in order to direct coolant flow away from the liquid-to-liquid heat exchangers. According to one embodiment of the invention, the valves may be oriented such that the facility side coolant, the coolant flowing through the facility side coolant supply line and the facility side coolant return line, bypasses all the liquid-to-liquid heat exchangers.

At the pressure reading discard step 314, pressure readings measured by the pressure sensors are discarded. At the leak detection system deactivation step 316, the leak detection system is turned off or deactivated.

Figure 4:
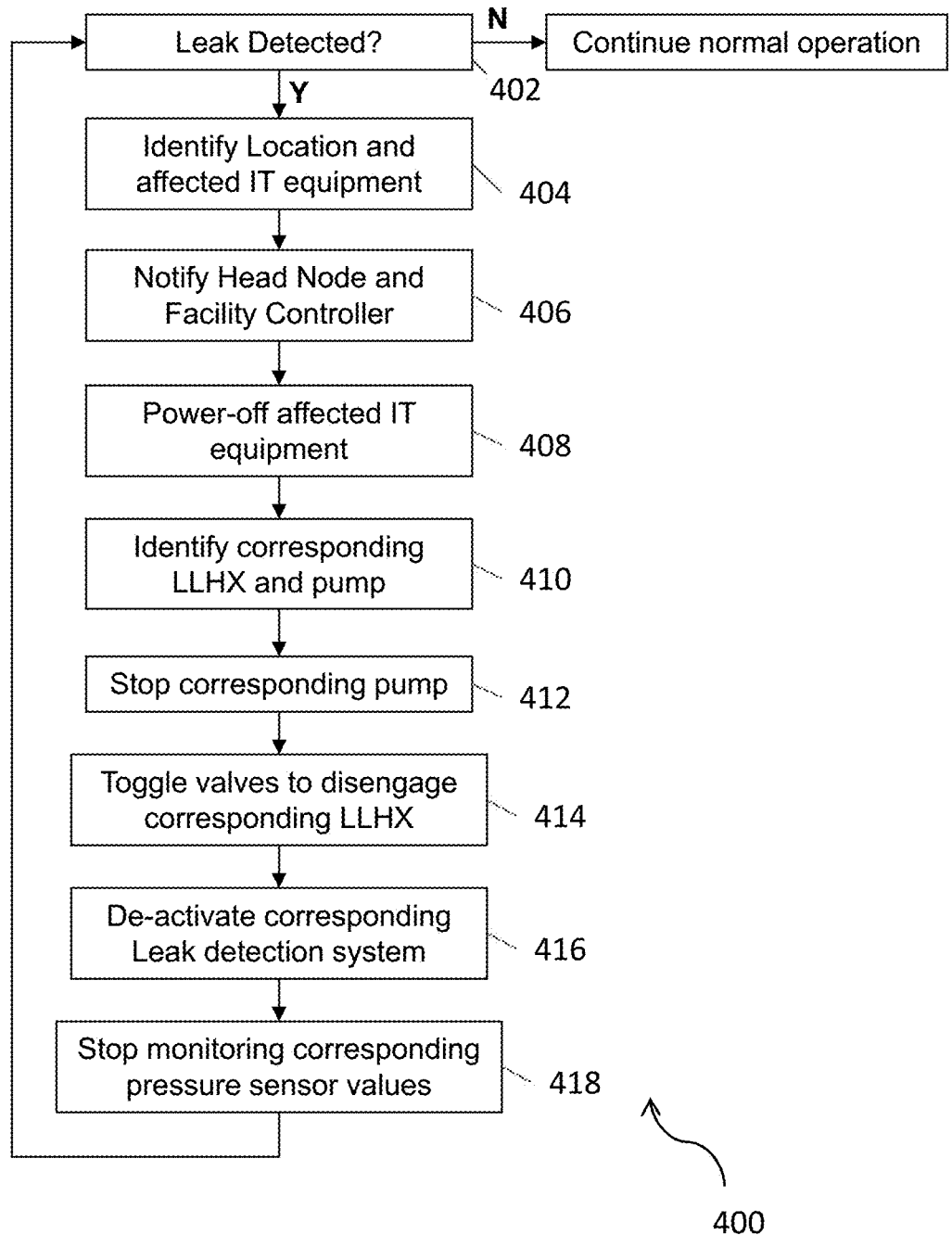
FIG. 4 shows a method of leak detection, which may be used in conjunction with the first method of liquid cooling shown in FIG. 3, in accordance with an embodiment of the invention.

FIG. 4 shows a method of leak detection 400 that may be used in conjunction with the first method of liquid cooling 300 shown in FIG. 3. The method of leak detection 400 incorporates the steps shown in FIG. 3 and described above, and proceeds to the steps shown in FIG. 4.

After the leak detection system activation step 310, the method of leak detection 400 proceeds to a leak detection step 402, as shown in FIG. 4. The coolant leak detection step 402 involves detecting a coolant leak. The coolant leak may be detected by the leak detection system.

According to an embodiment of the invention, if no leak is detected, the manifold continues operating in its current state.

After the coolant leak detection step 402, upon detection of the coolant leak, the method 400 proceeds to a server identification step 404. The server identification step 404 involves identifying the server or any other IT equipment affected by the coolant leak. Identifying the affected server or IT equipment includes identifying the location of said server or IT equipment.

After the server identification step 404, the method 400 proceeds to a controller notification step 406. At the controller notification step 406, the head node and the facility controller are notified regarding the coolant leak. In other words, information regarding the coolant leak and its location is conveyed to a facility controller or a head node. The facility controller may function to monitor and control the temperature in a data center containing the servers. The facility controller may also monitor coolant flow and temperature.

After the controller notification step 406, the method 400 proceeds to a server deactivation step 408. At the server deactivation step 408, the affected server or any other affected IT equipment are powered down or powered off.

After the server deactivation step 408, the method proceeds to a heat exchanger identification step 410. The heat exchanger identification step 408 involves identifying the liquid-to-liquid heat exchanger (LLHX) connected to the server affected by the coolant leak. The pump connected to the aforementioned liquid-to-liquid heat exchanger may also be identified. In other words, the heat exchanger identification step 410 may involve identifying the liquid-to-liquid heat exchanger and pump that correspond to the server affected by the coolant leak.

After the heat exchanger identification step 410, the method 400 proceeds to a pump deactivation step 412. At the pump deactivation step 412, the pump that is coupled to the liquid-to-liquid heat exchanger is deactivated. In other words, the pump deactivation step 412 may involve stopping the pump which corresponds to the server affected by the coolant leak. This pump may have been identified in the heat exchanger identification step 410.

After the pump deactivation step 412, the method proceeds to the heat exchanger deactivation step 414. At the heat exchanger deactivation step 414, coolant flow to the liquid-to-liquid heat exchanger is discontinued. The heat exchanger deactivation step 414 may involve manipulating a valve on the facility side coolant supply line in order to prevent coolant flow to from the facility side coolant supply line to the liquid-to-liquid heat exchanger. According to an embodiment of the invention, the heat exchanger deactivation step 414 may involve toggling valves on the facility side coolant supply line in order to disengage the liquid-to-liquid heat exchanger which corresponds to the server affected by the coolant leak.

After the heat exchanger deactivation step 414, the method proceeds to the leak detection system deactivation step 416. At the leak detection system deactivation step 416, the leak detection system is deactivated.

After the leak detection system deactivation step 416, the method proceeds to a cessation of pressure monitoring 418. At the cessation of pressure monitoring 418, pressure readings or pressure values measured by the pressure sensors corresponding to the server affected by the coolant leak are no longer monitored.

Figure 5:
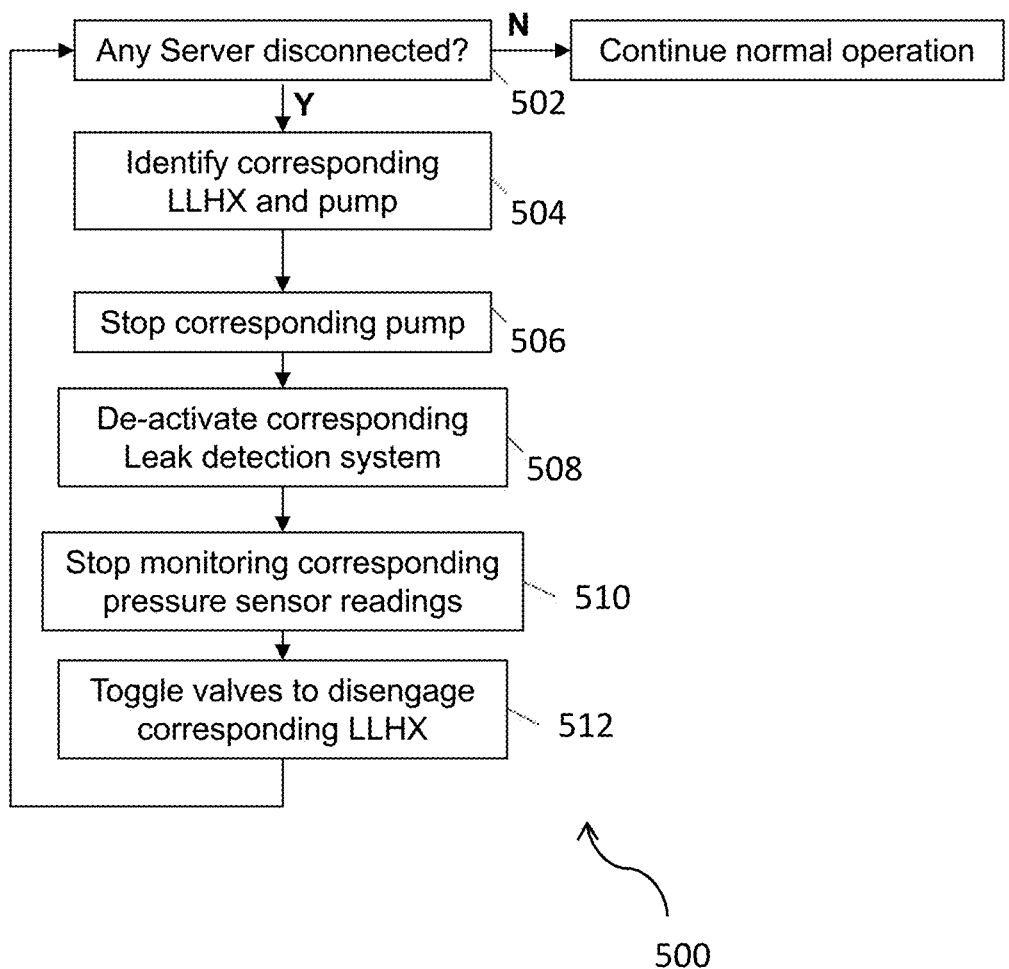
FIG. 5 shows a second method of liquid cooling, which may be used in conjunction with the first method of liquid cooling shown in FIG. 3, in accordance with an embodiment of the invention.

FIG. 5 shows a second method of liquid cooling 500 that may be used in conjunction with the first method of liquid cooling 300 shown in FIG. 3. The second method of liquid cooling 500 incorporates the steps shown in FIG. 3 and described above, and proceeds to the steps shown in FIG. 5.

After the leak detection system activation step 310, the method 500 proceeds to a disconnected server detection step 502, as shown in FIG. 5. The disconnected server detection step 502 may involve detecting that a server on a server rack is disconnected from the manifold. According to an embodiment of the invention, the disconnected server detection step 502 may involve determining if any previously connected servers have been disconnected from the manifold heat exchanger.

According to one embodiment of the invention, if no disconnected server is detected, the system continues to operate in its current state.

After the disconnected server detection step 502, the method proceeds to a disconnected heat exchanger identification step 504. The disconnected heat exchanger identification step 504 involves identifying the liquid-to-liquid heat exchanger that has been disconnected from the server. The disconnected heat exchanger identification step 504 may also involve identifying the pump coupled to the aforementioned liquid-to-liquid heat exchanger.

After the disconnected heat exchanger identification step 504, the method proceeds to a pump deactivation step 506. At the pump deactivation step 506, the pump coupled to the disconnected liquid-to-liquid heat exchanger is deactivated. The pump may correspond to the disconnected server.

After the pump deactivation step 506, the method proceeds to leak detection system deactivation step 508. At the leak detection system deactivation step 508, the leak detection system for the liquid-to-liquid heat exchanger is deactivated.

After the leak detection system deactivation step 508, the method proceeds to the cessation of pressure monitoring 510. At the cessation of pressure monitoring 510, measurement of pressure readings or pressure values by the pressure sensors is discontinued.

After the cessation of pressure monitoring 510, the method proceeds to a heat exchanger deactivation step 512. The heat exchanger deactivation step 512 may involve manipulating a valve on the facility side coolant supply line in order to prevent coolant flow to from the facility side coolant supply line to the liquid-to-liquid heat exchanger. In other words, the heat exchanger deactivation step 512 may involve toggling valves on the facility side coolant supply line in order to disengage the liquid-to-liquid heat exchanger which corresponds to the server affected by the coolant leak.

According to one embodiment of the invention, the method 500 may be used when a server is disconnected from the manifold heat exchanger.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A manifold for cooling electronic equipment, the apparatus manifold comprising:
   a facility side coolant supply line;
   a facility side coolant return line coupled to the manifold;
   a plurality of liquid-to-liquid heat exchangers connected in parallel to the facility side coolant supply line; and
   a plurality of pumps fastened to the manifold, each of the pumps is coupled to at least one of the liquid-to-liquid heat exchangers and regulates coolant flow through at least one of the liquid-to-liquid heat exchangers;
   a plurality of valves, the valves are coupled to the facility side coolant supply line, each of the valves controls the coolant flow from the facility side coolant supply line to a respective liquid-to-liquid heat exchanger; and
   a plurality of bypass lines, each of the valves regulates the coolant flow from the facility side coolant supply line between the respective liquid-to-liquid heat exchanger and a respective bypass line of the plurality of bypass lines.

2. The manifold of claim 1, wherein the liquid-to-liquid heat exchangers are connected in parallel to the facility side coolant return line.

3. The manifold of claim 1, wherein each of the pumps is coupled to a respective liquid-to-liquid heat exchanger and regulates the coolant flow through the respective liquid-to-liquid heat exchanger.

4. The manifold of claim 1, further comprising a plurality of pressure sensors, each of the pressure sensors are connected to a respective liquid-to liquid-heat exchanger.

5. The manifold of claim 4, further comprising mounting hardware for attaching the manifold to a server rack.

6. An apparatus for cooling electronic equipment comprising:
   a server rack to house a plurality of servers; and
   a manifold housed within the server rack, the manifold comprising:
     a facility side coolant supply line;
     a facility side coolant return line;
     a plurality of liquid-to-liquid heat exchangers connected in parallel to the facility side coolant supply line;
     a plurality of pumps fastened to the manifold, each of the pumps is coupled to at least one of the liquid-to-liquid heat exchangers and at least one of the servers, and wherein each of the pumps regulates coolant flow through at least one of the liquid-to-liquid heat exchangers and at least one of the servers;
     a plurality of valves, the valves are coupled to the facility side coolant supply line, each of the valves controls the coolant flow from the facility side coolant supply line to a respective liquid-to-liquid heat exchanger; and
     a plurality of bypass lines, each of the valves regulates the coolant flow from the facility side coolant supply line between the respective liquid-to-liquid heat exchanger and a respective bypass line of the plurality of bypass lines.

7. The apparatus of claim 6, wherein the pumps, the respective liquid-to-liquid heat exchangers, and the respective servers form a plurality of discrete coolant flow loops.

8. The apparatus of claim 6, wherein each of the pumps is coupled to the respective liquid-to-liquid heat exchanger and regulates the coolant flow through the liquid-to-liquid heat exchanger.

9. The apparatus of claim 6, wherein the manifold further comprises leak detectors to detect coolant leakage in the server rack.

10. A method of liquid cooling using a manifold:
    detecting that a server on a server rack is connected to the manifold;
    enabling liquid coolant to flow through a liquid-to-liquid heat exchanger connected to the server upon detecting that the server is connected to the manifold, wherein the liquid-to-liquid heat exchanger is one of a plurality of liquid-to-liquid heat exchangers connected in parallel at the manifold to a facility side coolant supply line; and
    activating a pump physically coupled to the liquid-to-liquid heat exchanger upon detecting that the server is connected to the manifold, the pump regulates coolant flow from the liquid-to-liquid heat exchanger to the server;
    detecting that the server on the server rack is disconnected from the manifold;
    identifying the liquid-to-liquid heat exchanger that has been disconnected from the server; and
    disabling coolant flow to the liquid-to-liquid heat exchanger that has been disconnected from the server by activating a valve diverting coolant flow from the liquid-to-liquid heat exchanger that has been disconnected from the server to one of a plurality of bypass lines within the manifold.

11. The method of claim 10, wherein enabling the liquid coolant to flow through the liquid-to-liquid heat exchanger includes manipulating a valve coupled to the facility side coolant supply line to allow the coolant flow from the facility side coolant supply line to the liquid-to-liquid heat exchanger.

12. The method of claim 10, further comprising enabling a coolant leak detection system for the server upon detecting that the server is connected to the manifold.

13. The method of claim 10, further comprising:
   deactivating the pump coupled to the liquid-to-liquid heat exchanger upon identifying the liquid-to-liquid heat exchanger.

\* \* \* \* \*